United States Patent [19]

Hebenstreit

[11] 4,302,685

[45] Nov. 24, 1981

[54] LINEAR OUTPUT STAGE FOR CHARGE-COUPLED CIRCUITS

[75] Inventor: Ernst Hebenstreit, Munich, Fed. Rep. of Germany

[73] Assignee: Siemens Aktiengesellschaft, Berlin & Munich, Fed. Rep. of Germany

[21] Appl. No.: 72,980

[22] Filed: Sep. 6, 1979

[30] Foreign Application Priority Data

Sep. 13, 1978 [DE] Fed. Rep. of Germany ....... 2839834

[51] Int. Cl.³ .................... G11C 19/28; H03K 3/353; H01L 29/78
[52] U.S. Cl. ............................. 307/221 D; 307/304; 357/24
[58] Field of Search .......... 357/24; 307/221 D; 307/04

[56] References Cited

U.S. PATENT DOCUMENTS

| | | | |
|---|---|---|---|
| 4,048,519 | 9/1977 | Hoffman et al. | 307/221 D |
| 4,074,206 | 2/1978 | Horninger | 307/221 D |
| 4,139,784 | 2/1979 | Sauer | 307/221 D |

OTHER PUBLICATIONS

Barbe "Imaging Devices Using the Charge-Coupled Concept" Proc. IEEE vol. 63 (1/75) pp. 38-67.

*Primary Examiner*—Gene M. Munson
*Attorney, Agent, or Firm*—Hill, Van Santen, Steadman, Chiara & Simpson

[57] ABSTRACT

A linear output stage for charge-coupled circuits is disclosed. Charge-coupled circuits (CCDs) are of significance in the processing of analogue signals as they can be used as analogue shift registers. Conventional output circuits of CCDs are constructed with source followers. The non-linear characteristic of an MOS source follower which is provided with an external load resistor is substantially linearized by means of a highly ohmic source resistor. A fundamental disadvantage of these output circuits is that the evaluation of the signal is mainly carried out by means of a space charge capacitance which is voltage-dependent since it is dependent upon space charge depth. In the output stage disclosed, the signal charge is mainly absorbed by means of a constant oxide capacitance of the evaluator electrode. The electrode receives the charge not in floating fashion but rather at a fixed potential.

5 Claims, 5 Drawing Figures

LINEAR OUTPUT STAGE FOR CHARGE-COUPLED CIRCUITS

BACKGROUND OF THE INVENTION

The invention relates to a linear output stage for charge-coupled circuits wherein an evaluator electrode of the output stage is connected to the input of an amplifier and wherein a switching transistor is provided whose gate terminal is supplied with a switching pulse train so that the switching transistor blocks during a read-out process and is switched conductive for a specific length of time between two read-out processes.

Charge-coupled circuits (CCD) are of significance for the processing of analogue signals since they can be used as analogue shift registers. Normal output circuits of charge-coupled elements are constructed with source followers wherein the non-linear characteristic of the MOS source follower which has an external load resistor is substantially linearized by means of a highly ohmic source resistor. An output circuit of this kind is described in the publication by D. F. Barbe "Imaging Devices Using The Charge Coupled Concept", Proceedings of the IEEE, Vol. 63, No. 1, January 1975, pages 38 to 67, incorporated herein by reference. A fundamental disadvantage of the described output circuit is that the evaluation of the signal is mainly carried out by means of a space charge capacitance which is voltage dependent since it is dependent upon the space charge depth.

The German AS No. 2 602 520 corresponding to U.S. Pat. No. 4,074,206 incorporated herein by reference discloses a linear output amplifier for charge-coupled elements wherein an amplifier is provided with a switching transistor and a load element, wherein the switching transistor and the load element are connected in series to one another at a point which represents the output of the amplifier. A gate terminal of the switching transistor represents the input of the amplifier. This input is connected to the CCD arrangement. The output of the amplifier is connected via an auxiliary transistor to the input of the amplifier. The gate terminal of the auxiliary transistor is connected to a pulse source which blocks the transistor during the read-out process and switches it conductive between the read-out processes.

In this known circuit arrangement, in order to prevent pulse train input couplings, two additional transistors must be provided by means of which the source and drain terminals of the auxiliary transistor can be disconnected. However, this results in tolerance problems. Although this known circuit arrangement offers the advantage that the described MOS amplifier is always operated in the linear range, a non-linearity, due to the voltage-dependent space charge capacitance of the signal output, continues to prevail.

SUMMARY OF THE INVENTION

An object of the present invention is to provide a linear output stage for charge-coupled elements wherein the above described disadvantages are avoided.

This object is achieved by a linear output stage for charge-coupled circuits as already mentioned above, wherein the switching transistor is inserted into the output stage between a pulse train line supplying a first shift pulse train and the evaluator electrode. The switching pulse train occurs at a time such that prior to the read-out process the pulse train line which supplies the first shift pulse train is connected through to the evaluator electrode so that when the evaluator electrode receives the signal charge it has a fixed bias rather than being floating, and during the read-out process it is isolated from the evaluator electrode. The output stage also has a follower electrode permanently connected to an auxiliary potential and a diode means connected to a pulse train source supplying a first auxiliary pulse train for creating a given surface potential in the output stage.

The invention is based on recognizing the fact that on the one hand linearization can be achieved by reducing the influence of the voltage-dependent space charge capacitances due to the cooperation of constant oxide capacitances which are known per se, and on the other hand at least a partial compensation of the signal distortion can be achieved by the opposing nature of the space charge depths of input space charge capacitances and output space charge capacitances.

A fundamental advantage of the invention consists in that the evaluator electrode receives the signal charge, not in floating fashion, but with a fixed potential. The conversion of the charge is fundamentally carried out by means of the constant oxide capacitance of the electrode, and the interrogation of the signal is carried out following the disconnection of the voltage source from the evaluator electrode by the impression of a fixed surface potential via a diode, whereby all the fundamental influences which obstruct linearity are substantially eliminated. Moreover the output stage in accordance with the invention can advantageously be designed compatibly with known CCD input circuits.

DESCRIPTION OF THE PREFERRED EMBODIMENTS

Figure 1:
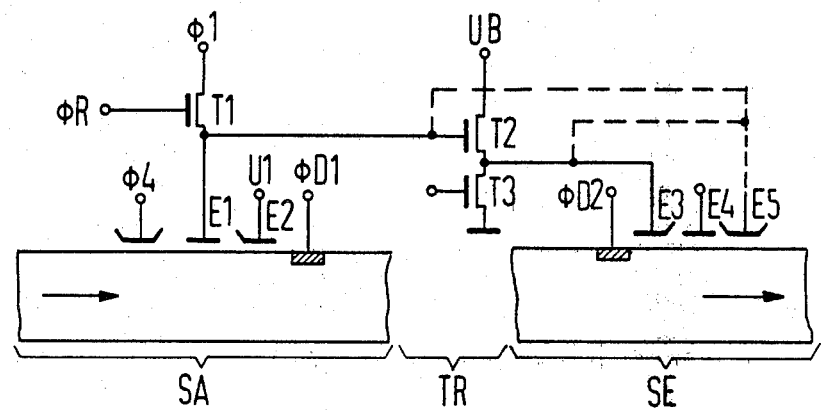
FIG. 1 illustrates a circuit arrangement for the output stage in accordance with the invention and further circuit components which for example cooperate therewith.

As already indicated, FIG. 1 illustrates a circuit arrangement of the inventive output stage and additional circuit parts cooperating with said output stage. The linear output stage is here referenced with SA, a driver stage with TR, and a "fill and spill"-input stage, with SE. An evaluation electrode $E_1$ contains the regular clock pulse voltage $U\phi 1$ of a first shifter clock pulse $\phi 1$. By means of a switching transistor T1, to whose gate-terminal a switching clock pulse $\phi R$ is supplied, the evaluation electrode EL can be separated from $\phi 1$. Beside the evaluator electrode E1 there is arranged a follower electrode E2 with a fixed auxiliary potential U1 and a diffusion zone which is pulsed with a first auxiliary pulse train $\phi D1$. Both these serve to temporarily set up a fixed surface potential $\phi SA$ beneath the evaluator electrode E1 during the interrogation of a signal. E1 is connected to the input of a source follower which consists of a driver transistor T2 and a load transistor T3 and acts as driver stage TR, whose output is connected to a first control electrode E3 and a third control electrode E5 of the "fill and spill" input stage SE. The driver stage is connected to an operating voltage potential UB. Under specific circumstances it is also possible to directly operate the electrode E5 by bypassing the driver stage TR. In addition to the aforementioned control electrodes, a second control electrode E4 and a diffusion zone pulsed with a second auxiliary pulse train $\phi D2$ are additionally provided in the "fill and spill" input stage SE.

Figure 2:
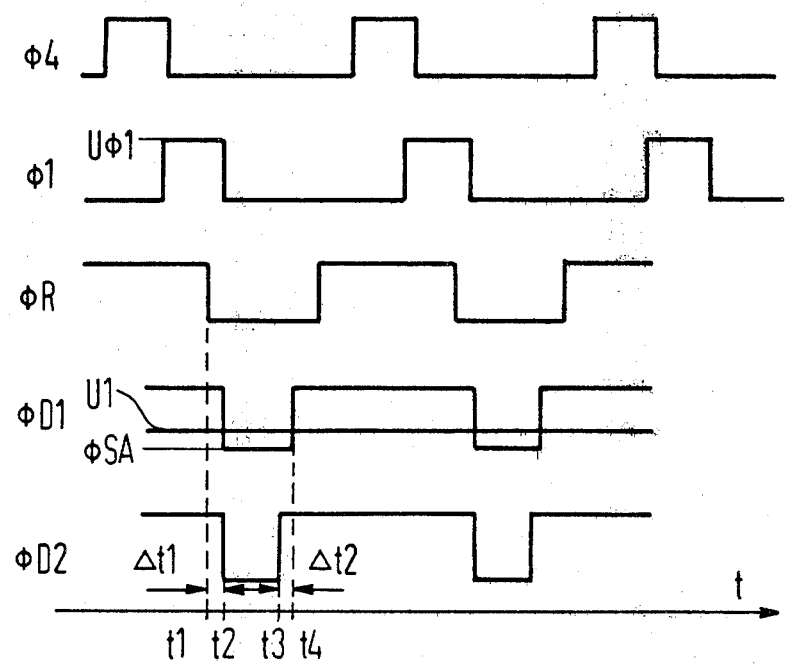
FIG. 2 illustrates a clock pulse plan for the operation of the output stage.

The mode of operation will now be explained in the form of the pulse diagram illustrated in FIG. 2. When, during regular CCD operation, a signal charge QS has been fully received by E1, the switching transistor T1 is blocked by means of $\phi R$ (first time t1). Now, after a suitable first time interval $\Delta t1$, at a second time t2 a suitable low surface potential $\phi SA$ is set up beneath E1, where the quantity (U1-$\phi SA$) must exceed the starting voltage. The signal stored in the oxide capacitance of E1 is thus forwarded to T2, and E3 or E5. The analysis must now be concluded before the impression of $\phi SA$ is discontinued. Therefore the negative pulse train phase of $\phi D2$ must end earlier, namely at a third time t3, than that of $\phi D1$ (second time interval $\Delta t2$), whereas their starting times can be identical. Following these procedures and after a fourth time t4 but before the beginning of the last shift pulse train $\phi 4$ of the shift pulse train cycle, the switching pulse train $\phi R$ ends the blockage of T1.

Figure 3:
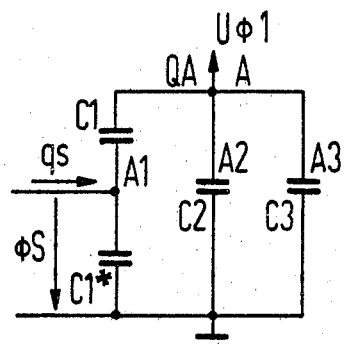
FIG. 3 illustrates a first equivalent circuit diagram for the inventive circuit arrangement in the phase of the signal charge take-up.
Figure 4:
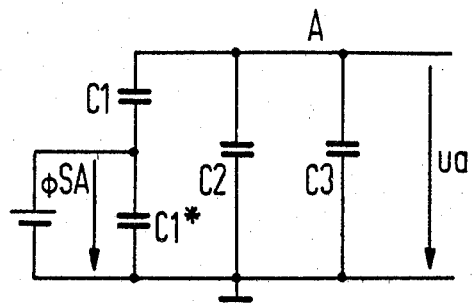
FIG. 4 illustrates a second equivalent circuit diagram for the inventive circuit arrangement in the phase of the signal voltage emission.

As already mentioned, FIGS. 3 and 4 represent a first and second equivalent circuit diagram of the circuit arrangement corresponding to the invention for the signal charge reception phase (FIG. 3), and the signal voltage emission phase (FIG. 4). In these figures:

$\phi S$—surface voltage
qs—signal charge
C1—oxide capacitance of the evaluator electrode
C1*—space charge capacitance of the evaluator electrode
C2—gate capacitance of the driver
C3—space charge capacitance of the source zone of the switching transistor
A—node
QA—sum charge in node A
A1—area of the evaluator electrode
A2—area of the gate of the driver
A3—area of the source zone of the switching transistor
U$\phi$1—regular pulse train voltage
$\phi SA$—fixed impressed surface potential
ua—output signal voltage Analytical investigations have shown that the compensation of the non-linear influences can be optimized by an appropriate selection of the area ratio A3/A1. In order to illustrate the non-linear deviations, the relative changes in the curve gradients $\Delta S$ of the circuit arrangement in accordance with the invention have been shown in dependence upon the operating point in FIG. 5, assuming specific technical relevant operating parameters. CO1 is a normalization parameter to relate a value of $\phi SA$ to a value of qs; and $\Delta S$ is the relative change in gradient of curves of the circuit characteristic ua versus $\phi SA$ for various values of A3/A1.

Figure 5:
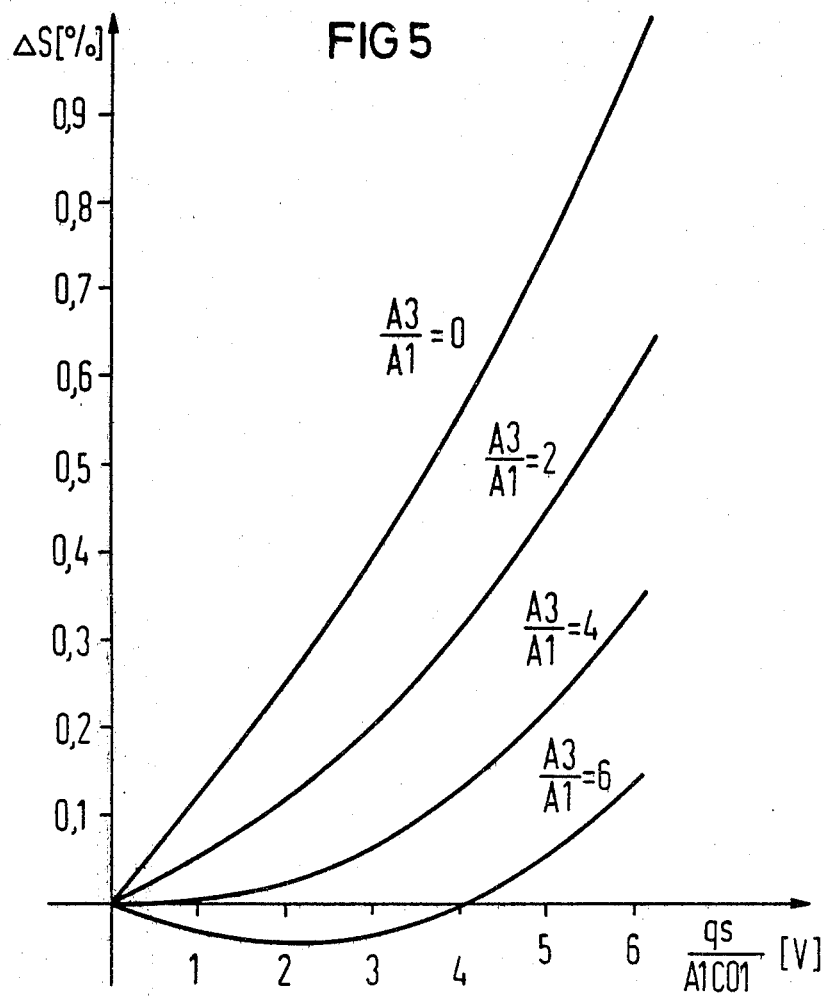
FIG. 5 illustrates a group of characteristic curves for operation with different assumed parameters.

The ratio A2/A1 has been assumed to be a constant 1, and A3/A1 has been varied as a parameter. Other parameter values used are shown in FIG. 5. The maximum deviations occur when A3/A1=0, thus in the absence of C3. With increasing values of A3/A1, the linearity is improved. When A3/A1=6 approximately the optimum is achieved. It may be gathered from this sequence that the non-linear influences of C1* and C3 are opposing and permit a partial compensation.

It can also be seen from the curves that the curve gradient reduces with an increasing operating point qs/A1CO1 (the sign of qs is negative!). Advantageously the curve of a source follower exhibits the opposite tendency. Consequently this provides an additional compensation possibility.

It has already been mentioned that direct coupling facilities exist with respect to E5, but not with respect to E3. The reason for this is that beneath E5 the surface potential in the determination of the charge is governed by E3 and consequently only the oxide capacitance appears. Thus the conditions are similar to those which exist when a driver is used. This does not apply to the input capacitance of E3.

The linear output stage in accordance with the invention is not limited to the use of so-called 4-phase CCDs. In fact it is also suitable for 2-phase or 3-phase CCDs.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A linear output stage system for charge-coupled circuits, comprising: a charge coupled circuit on a semiconductor substrate; an output stage of the charge coupled circuit having an evaluator electrode over the substrate connecting to an input of a following stage; a switching transistor whose gate terminal is supplied with a switching pulse train means for blocking the switching transistor during a read-out process and switching it conductive for a specific length of time between two read-out processes, the switching transistor being inserted into the output stage between a pulse train line supplying a first shift pulse train and said evaluator electrode; said switching pulse train means occurring at a time such that prior to the read-out process said first shift pulse train is connected through to the evaluator electrode so that when the evaluator electrode receives the signal charge it has a fixed bias rather than being floating, and during the read-out process the first shift pulse train is isolated from the evaluator electrode; and the output stage also having a follower electrode over the substrate in fixed connection to an auxiliary potential, and a diode means connected to a pulse train source supplying a first auxiliary pulse train for creating a given surface potential in the output stage.

2. A linear output stage system as claimed in claim 1 wherein the evaluator electrode is connected to the input of a driver stage having a driver transistor and a load transistor and connected to operate as a source follower, an output of the driver stage being connected to a control electrode over a substrate of an input stage.

3. A linear output stage as claimed in claim 2 wherein the evaluator electrode is directly connected to the control electrode of the input stage.

4. A method for the operation of a linear output stage system for charge coupled circuits having a linear output stage of a charge coupled circuit on a semiconductor substrate with an evaluator electrode over the substrate connected to a first shift pulse train by a switching transistor controlled by a switching pulse train, a following electrode over the substrate connected to a fixed auxiliary potential, and a diode in the substrate connecting to a first auxiliary pulse train, an input stage also being provided connecting to the output stage evaluator electrode and having a second auxiliary pulse train, comprising the steps of: fully absorbing a signal charge when the evaluator electrode carries a fixed potential; at a first time which occurs before the end of the first shift pulse train, switching off the switching pulse train so as to block the switching transistor; following a first interval of time switching on at a second time the first auxiliary pulse train and a second auxiliary pulse train in the input stage provided for the signal transfer, the first auxiliary pulse train setting up the surface potential beneath the evaluator electrode such that a difference between itself and the fixed auxiliary potential exceeds a start voltage; at a third time switching off the second auxiliary pulse train; following a second interval of time switching off the first auxiliary pulse train at a fourth time; and the switching pulse train switching the switching transistor conductive again before the beginning of a last shift pulse train of the charge coupled device.

5. A linear output stage system for charge-coupled circuits, comprising: a charge-coupled circuit on a semiconductor substrate; an output stage at one end of the charge-coupled circuit; the output stage having an evaluator electrode over the substrate, a follower electrode over the substrate adjacent the evaluator electrode, and a diffused region in the substrate as a diode adjacent the follower electrode; the output stage feeding a following stage at its evaluator electrode and also having a switching transistor whose gate terminal is connected to a switching pulse train means for blocking the switching transistor during a read-out process and switching it conductive for a specific length of time between two read-out processes, the switching transistor being inserted into the output stage between a pulse train line supplying a first shift pulse train and said evaluator electrode; said switching pulse train means occurring at a time such that prior to the read-out process said first shift pulse train is connected through to the evaluator electrode so that when the evaluator electrode receives the signal charge it has a fixed bias rather than being floating, and during the read-out process the first shift pulse train is isolated from the evaluator electrode; and the output stage follower electrode being connected to an auxiliary potential and the diode being connected to a pulse train source means for supplying a first auxiliary pulse train for creating a given surface potential in the output stage.

* * * * *